US012581675B2

(12) United States Patent
Nagata

(10) Patent No.: US 12,581,675 B2
(45) Date of Patent: Mar. 17, 2026

(54) SEMICONDUCTOR DEVICE

(71) Applicant: RENESAS ELECTRONICS CORPORATION, Tokyo (JP)

(72) Inventor: Nao Nagata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 370 days.

(21) Appl. No.: 18/470,808

(22) Filed: Sep. 20, 2023

(65) Prior Publication Data

US 2024/0145586 A1 May 2, 2024

(30) Foreign Application Priority Data

Oct. 31, 2022 (JP) ................................. 2022-174696

(51) Int. Cl.
| | |
|---|---|
| *H10D 12/00* | (2025.01) |
| *H10D 62/10* | (2025.01) |
| *H10D 62/17* | (2025.01) |
| *H10D 64/00* | (2025.01) |
| *H10D 64/27* | (2025.01) |

(52) U.S. Cl.
CPC ......... *H10D 12/481* (2025.01); *H10D 62/127* (2025.01); *H10D 62/393* (2025.01); *H10D 64/117* (2025.01); *H10D 64/513* (2025.01)

(58) Field of Classification Search
CPC .. H10D 12/481; H10D 62/127; H10D 62/393; H10D 64/117
See application file for complete search history.

(56) References Cited

U.S. PATENT DOCUMENTS 10,505,029 B2 12/2019 Nagata

FOREIGN PATENT DOCUMENTS

JP 2019-029434 A 2/2019

*Primary Examiner* — Matthew L Reames
(74) *Attorney, Agent, or Firm* — Rimon P.C.

(57) ABSTRACT

An IGBT includes first and second trenches arranged side by side on a front surface of a semiconductor substrate, a collector region formed on a back surface side of the semiconductor substrate, a body region and an emitter region provided between the first and second trenches, a first trench gate electrode provided in the first trench, a second trench gate electrode provided in the second trench, a third trench gate electrode provided below the first trench gate electrode in the first trench, a fourth trench gate electrode provided below the second trench gate electrode in the second trench, and a floating region formed in the semiconductor substrate with the first and second trenches interposed therebetween.

13 Claims, 15 Drawing Sheets

CE    CR    FS      DF          BP2          BP1

CE   CR   FS

Equivalent circuit $$C = \frac{C1 * C2}{C1 + C2}$$

$R$       $L = L1 + L2$ $$f = \frac{1}{2\pi\sqrt{LC}}$$

$$Q = \frac{1}{R}\sqrt{\frac{L}{C}} > 0.5$$

SEMICONDUCTOR DEVICE

CROSS-REFERENCE TO RELATED APPLICATIONS

The disclosure of Japanese Patent Application No. 2022-174696 filed on Oct. 31, 2022 including the specification, drawings and abstract is incorporated herein by reference in its entirety.

BACKGROUND

The present invention relates to a semiconductor device, and particularly to a technique effectively applied to an IE type trench gate IGBT.

There is disclosed a technique listed below.
[Patent Document 1] Japanese Unexamined Patent Application Publication No. 2019-29434

As an insulated gate bipolar transistor (IGBT) having a low collector-emitter saturation voltage VCE (sat), a trench gate IGBT is widely used. In order to further promote conductivity modulation, an injection enhancement (IE) type trench gate IGBT utilizing an IE effect has been developed. There is an IE type trench gate IGBT having a structure in which holes are easily accumulated on a device main surface side (emitter side) of a semiconductor substrate by alternately arranging active cells actually connected to an emitter electrode and inactive cells having a floating P body region in a cell region (for example, Japanese Unexamined Patent Application Publication No. 2019-29434). In this type of the IE type trench gate IGBT, holes injected from the collector side are prevented from exiting to the emitter side by the inactive cell region, so that the concentration of holes between the active cell region and the collector side increases. When the concentration of holes increases, injection of electrons from the emitter (source) side is promoted, and the concentration of electrons also increases. Due to such an increase in carrier concentration (IE effect), conductivity modulation occurs, and VCE (sat) can be lowered.

SUMMARY

In an in-trench double gate type power MOSFET, there is a problem in which, in a case where the source potential is supplied to a field plate electrode, on-resistance of the MOSFET is higher than in a case where the gate potential is supplied. That is, an object is to achieve lowering of the on-resistance of the element while maintaining advantages (reduction of a switching loss, reduction of surge voltage, and an increase of the margin against false turn on) obtained by supplying the source potential to the field plate electrode.

Other objects and novel features will become apparent from the description of the present specification and the accompanying drawings.

An outline of a representative embodiment out of embodiments disclosed in the present application will briefly be described as follows.

A semiconductor device according to an embodiment includes a first trench and a second trench arranged side by side on a front surface of a semiconductor substrate, a collector region formed on a back surface side of the semiconductor substrate, a body region and an emitter region provided between the first trench and the second trench, a first trench electrode provided in the first trench, a second trench electrode provided in the second trench, a third trench electrode provided below the first trench electrode in the first trench, a fourth trench electrode provided below the second trench electrode in the second trench, and a floating region formed in the semiconductor substrate with the first trench and the second trench interposed therebetween.

According to one embodiment, performance of a semiconductor device can be improved.

DETAILED DESCRIPTION

Figure 1:
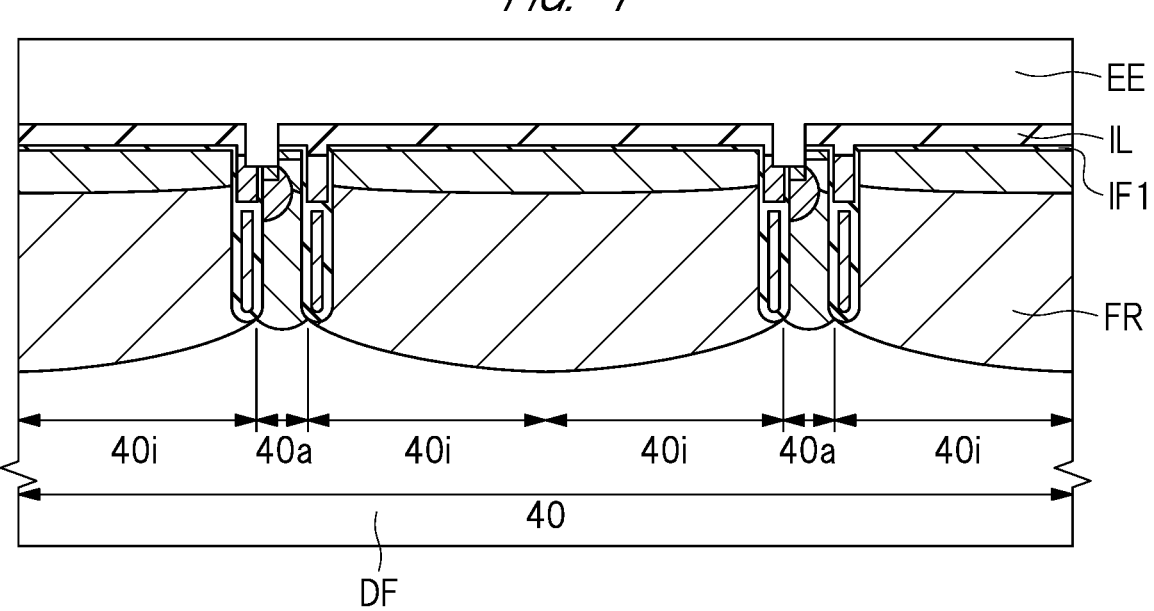
FIG. 1 is a cross-sectional view illustrating a semiconductor device according to a first embodiment.

In the following embodiments, when necessary for the sake of convenience, the description will be divided into a plurality of sections or embodiments, but unless otherwise specified, the sections or embodiments are not unrelated to each other, and one is in a relationship of some or all modifications, details, supplementary explanation, and the like of the other. In addition, in the following embodiments, when referring to the number of elements and the like (including number, numerical value, amount, range, and the like), the number is not limited to the mentioned number, and may be equal to or more than the mentioned number or equal to or less than the mentioned number, unless otherwise specified or obviously limited to a specific number in principle.

Furthermore, in the following embodiments, it goes without saying that the components (including element steps and the like) are not necessarily essential unless otherwise specified or considered to be obviously essential in principle. Similarly, in the following embodiments, when referring to the shape, positional relationship, and the like of the components and the like, it is assumed to include those substantially approximate or similar to the shape and the like unless otherwise stated or obviously considered not to include those in principle. The same applies to the above numerical values and ranges.

Hereinbelow, embodiments will be described in detail with reference to the drawings. In all the drawings for describing the embodiments, members having the same functions are denoted by the same reference signs, and repeated description thereof will be omitted. In addition, in the following embodiments, descriptions of the same or similar parts will not be repeated in principle unless particularly necessary.

First Embodiment

<Structure of Semiconductor Device>

A semiconductor device according to the present embodiment will be described below with reference to FIGS. 1 to 11.

The semiconductor device according to the present embodiment includes an IGBT. The IGBT includes a trench gate electrode or a trench emitter electrode between an active cell region and an inactive cell region, and the trench gate electrode and the trench emitter electrode are provided with the inactive cell region interposed therebetween.

The semiconductor device according to the present embodiment is an IE type trench gate IGBT, and is a GE (including a trench connected to a gate potential and a trench connected to an emitter potential) type IGBT including a trench gate electrode or a trench emitter electrode between an active cell region and an inactive cell region. The active cell region is narrower than that in a GG type IGBT including a trench gate electrode between the active cell region and each of two inactive cell regions having the active cell region interposed therebetween. Therefore, the GE type IGBT according to the present embodiment is also referred to as a GE-S (a shrink type including a trench connected to a gate potential and a trench connected to an emitter potential) type IGBT.

Figure 2:
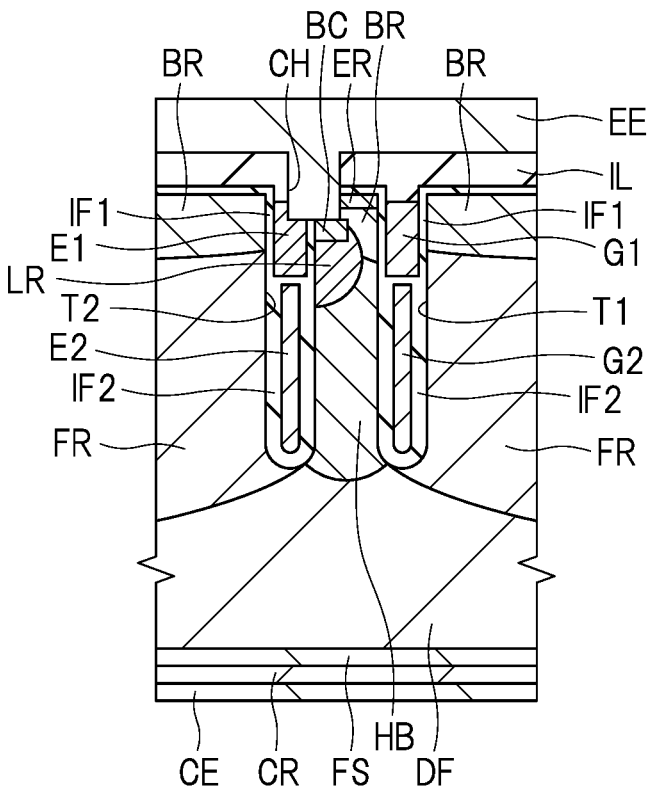
FIG. 2 is an enlarged view of a main part of FIG. 1.

FIG. 1 is a cross-sectional view of an IGBT according to the present embodiment. FIG. 2 is an enlarged view of a main part of FIG. 1. FIG. 1 illustrates a cross section of a semiconductor chip which is a semiconductor device according to the present embodiment, and the semiconductor chip includes a semiconductor substrate and an IGBT which is a semiconductor element provided in the semiconductor substrate. The semiconductor substrate includes a first main surface (front surface) and a second main surface (back surface) opposite to the first main surface.

As illustrated in FIG. 1, a unit cell region 40 of the IGBT includes an active cell region 40a and an inactive cell region 40i, and a trench gate electrode G1 and a trench gate electrode E1 illustrated in FIG. 2 are disposed between the active cell region 40a and the inactive cell region 40i. The trench gate electrode G1 is provided in a trench T1, and the trench gate electrode E1 is provided in a trench T2.

As illustrated in FIG. 2, a collector region CR, which is a P$^+$ type semiconductor region, is provided in a semiconductor region on the back surface of the semiconductor substrate, and a collector electrode CE is provided on the back surface of the semiconductor substrate. A field stop region FS, which is an N type semiconductor region, is provided between a drift region DF, which is an N$^-$ type semiconductor region constituting a main part of the semiconductor substrate, and the collector region CR, which is a P$^+$ type semiconductor region. On the drift region DF in the active cell region 40a, a hole barrier region HB, which is an N type semiconductor region, a body region BR, which is a P type semiconductor region, and an emitter region ER are provided in order from the bottom. The emitter region ER, which is an N$^+$ type semiconductor region, is provided only on the side provided with the trench gate electrode G1.

In addition, an interlayer insulating film IL is formed on the trench gate electrode G1, the trench gate electrode E1, the body region BR, and the emitter region ER. A contact groove (a contact hole or a connection hole) CH extending into the trench gate electrode E1 and the semiconductor substrate is formed in a portion of the interlayer insulating film IL in the active cell region 40a. In the semiconductor substrate at the bottom of the contact groove CH, a body contact region BC, which is a P$^+$ type semiconductor region, and a latch-up prevention region LR, which is a P$^+$ type semiconductor region, are provided in contact with the trench T1 in order from the top. The body region BR and the emitter region ER are connected to an emitter electrode EE provided on the interlayer insulating film IL via the contact groove CH and the like.

In other words, the drift region DF is formed in the semiconductor substrate. The collector region CR is formed in the semiconductor substrate between the back surface of the semiconductor substrate and the drift region DF. The bottom surface of the collector region CR is covered with the collector electrode CE made of a metal film connected to the collector region CR. The collector region CR is electrically connected to the collector electrode CE. The field stop region FS is formed in the semiconductor substrate between the collector region CR and the drift region DF. On the front surface of the semiconductor substrate at one of the boundaries between the active cell region 40*a* interposed between the two inactive cell regions 40*i* and each of the two inactive cell regions 40*i*, the trench T1 reaching the intermediate depth of the semiconductor substrate is formed, and on the front surface of the semiconductor substrate at the other boundary, the trench T2 reaching the intermediate depth of the semiconductor substrate is formed. The depths of the trenches T1 and T2 are equivalent to each other, and the bottoms of the trenches do not reach the boundary between the drift region DF and the field stop region FS.

The hole barrier region HB in contact with each of the trenches T1 and T2 is formed in the semiconductor substrate between the drift region DF and the front surface of the semiconductor substrate, which is the active cell region 40*a* between the trenches T1 and T2. The hole barrier region HB is in contact with each of the latch-up prevention region LR and the body region BR formed side by side in the semiconductor substrate between the hole barrier region HB and the front surface of the semiconductor substrate. The latch-up prevention region LR is in contact with the trench T2, and the body region BR of the active cell region 40*a* is in contact with the trench T1. In the semiconductor substrate between the front surface of the semiconductor substrate and the latch-up prevention region LR, the body contact region BC is formed in contact with the latch-up prevention region LR. In the semiconductor substrate between the front surface of the semiconductor substrate and the body region BR, the emitter region ER is formed in contact with the body region BR.

In the trench T1, the trench gate electrode G1 is formed via an insulating film (gate insulating film) IF1. In the trench T2, a trench gate electrode E1 is formed via the insulating film (gate insulating film) IF1. The interlayer insulating film IL is formed on the front surface of the semiconductor substrate via the insulating film IF1. The emitter electrode (emitter interconnect) EE made of a metal film is formed on the interlayer insulating film IL. In the interlayer insulating film IL, the contact groove CH penetrating the interlayer insulating film IL is formed. The contact groove CH reaches the intermediate depth of the semiconductor substrate, and the bottom surface of the contact groove CH is located in a region above the bottom surface of the body region BR. The contact groove CH overlaps with the trench T2 and the semiconductor substrate of the active cell region 40*a* adjacent to the trench T2 in a planar view. A contact plug (conductive connection portion), which is a part of the emitter electrode EE embedded in the contact groove CH, is in contact with the trench gate electrode E1 and is in contact with the body contact region BC at the bottom surface of the contact groove CH. In addition, one side surface of the contact plug, which is a part of the emitter electrode EE, is in contact with the emitter region ER on a side surface of the contact groove CH, and the other side surface is in contact with the trench gate electrode E1 on another side surface of the contact groove CH. The emitter electrode EE is electrically connected to the latch-up prevention region LR and the body region BR via the body contact region BC. The emitter electrode EE is electrically connected to the emitter region ER.

Here, as one of main features of the present embodiment, a trench gate electrode G2 is provided in the trench T1 as well as the trench gate electrode G1, and a trench gate electrode E2 is provided in the trench T2 as well as the trench gate electrode E1. Specifically, the trench gate electrode G2 is formed below the trench gate electrode G1 in the trench T1. In other words, the trench gate electrode G2 is formed between the trench gate electrode G1 and the back surface of the semiconductor substrate in the trench T1. Similarly, the trench gate electrode E2 is formed below the trench gate electrode E1 in the trench T2. In other words, the trench gate electrode E2 is formed between the trench gate electrode E1 and the back surface of the semiconductor substrate in the trench T2.

The trench gate electrode G2 is formed in the trench T1 via an insulating film IF2, and the trench gate electrode E2 is formed in the trench T2 via the insulating film IF2. The film thickness of the insulating film IF2 is larger than the film thickness of the insulating film IF1. In other words, in the trench T2, the insulating film IF2 formed between the trench gate electrode E2 and the trench T1 is larger in thickness than the insulating film IF1 formed between the trench gate electrode E1 and the trench T1. Also, in the trench T1, the insulating film IF2 formed between the trench gate electrode G2 and the trench T2 is larger in thickness than the insulating film IF1 formed between the trench gate electrode G1 and the trench T2.

The trench gate electrodes G1 and G2 are away from each other via the insulating film IF1. The trench gate electrodes E1 and E2 are away from each other via the insulating film IF1. Here, the trench gate electrode E2 is insulated from any of the trench gate electrodes E1, G1, and G2.

The semiconductor substrate is mainly made of, for example, silicon (Si). Each of the trench gate electrodes G1, G2, E1, and E2 is made of a conductive member, and is made of, for example, a polysilicon film. The insulating films IF1 and IF2 and the interlayer insulating film are made of, for example, a silicon oxide film. The structure illustrated in FIGS. 1 and 2 extends in the depth direction of each of the figures.

The hole barrier region HB is a barrier region for preventing holes from flowing into a passage from the drift region DF to the emitter region ER, and the impurity concentration therein is lower than that of the emitter region ER and higher than that of the drift region DF. The presence of the hole barrier region HB can effectively prevent holes accumulated in the inactive cell region 40*i* from entering the emitter passage (passage from the drift region DF toward the body contact region BC) of the active cell region 40*a*. The field stop region FS has a role of preventing the depletion layer from extending to the front surface side of the semiconductor substrate.

The trenches T1 and T2 are formed by penetrating the body region BR formed on the front surface of the semiconductor substrate, and the body region BR, which is a P type semiconductor region, is also formed over a predetermined depth from the front surface of the semiconductor substrate in the inactive cell region 40*i* on the opposite side of the body region BR of the active cell region 40*a* across the trench T1 or T2. In the inactive cell region 40*i*, a floating region FR, which is a P type semiconductor region, is formed between the body region BR and the drift region DF. The depth of the floating region FR is deeper than the depth of each of the trenches T1 and T2 and is distributed so as to cover the lower end portion of each of the trenches T1 and T2.

The P type collector region CR, the N type drift region DF and hole barrier region HB, the P type body region BR, the N type emitter region ER, and the trench gate electrode G1 constitute an IGBT. The IGBT according to the present embodiment further includes at least the trench gate electrodes E1, E2, and G2, the floating region FR, and the latch-up prevention region LR.

<Reduction of Switching Turn Off Loss>

In the present embodiment, a first emitter potential is applied to the emitter region ER and the trench gate electrode E1, and a second emitter potential different from the first emitter potential is applied to the trench gate electrode E2. In addition, the same gate potential is applied to the trench gate electrodes G1 and G2. A collector potential is applied to the collector region CR. That is, the IGBT according to the present embodiment is a four-terminal element in which the gate potential, the first emitter potential, the second emitter potential, and the collector potential are separately applied and controlled.

Figure 3:
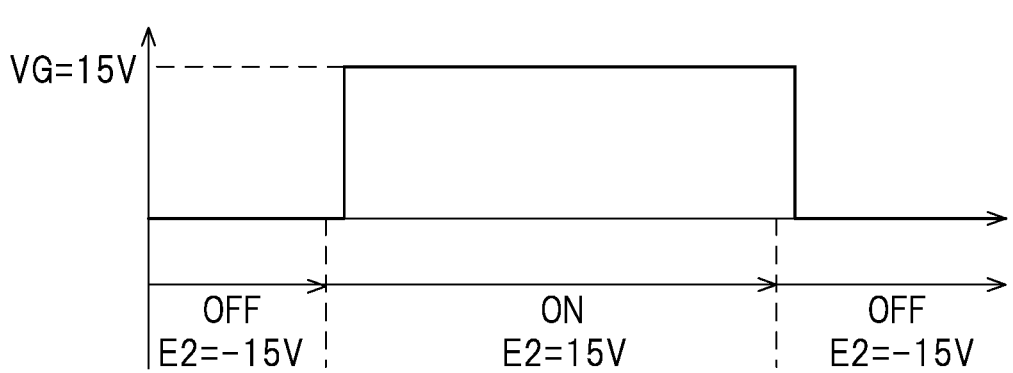
FIG. 3 is a timing chart illustrating a second emitter potential and a gate potential in the semiconductor device according to the first embodiment.
Figure 4:
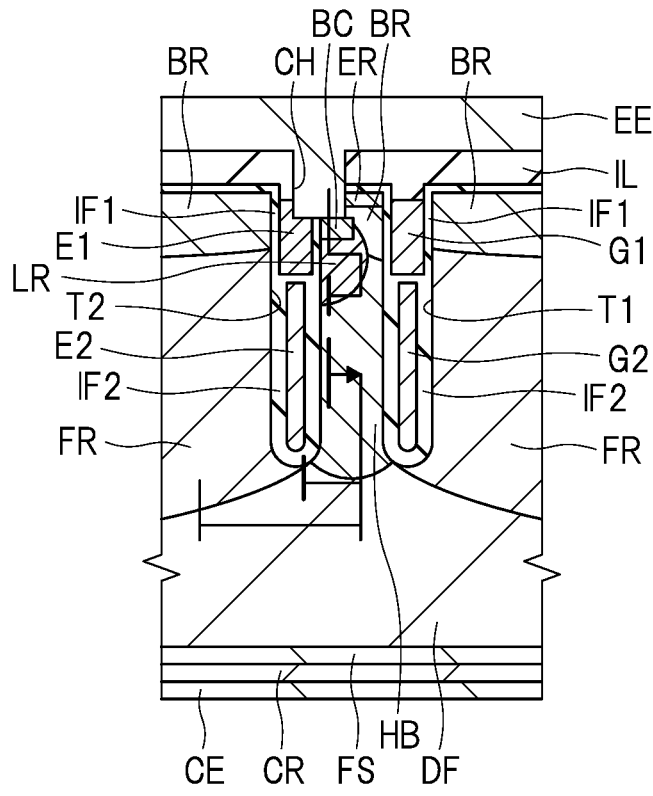
FIG. 4 is a cross-sectional view illustrating a parasitic P channel MOSFET in the semiconductor device according to the first embodiment.

In this manner, independent voltage control from that on the other gate electrodes is performed on the trench gate electrode E2. FIG. 3 is a timing chart illustrating a potential (second emitter potential) of the trench gate electrode E2 and a potential (gate potential) of the trench gate electrode G1. FIG. 4 is a cross-sectional view illustrating a parasitic P channel MOSFET (hereinbelow, referred to as a parasitic PMOS) generated in the trench T2.

FIG. 3 illustrates a transition state in order of an off period (off time), an on period (on time: conduction period), and an off period (off time) of the IGBT as time passes. To the trench gate electrode E2, –15 V is applied in the off period, and +15 V is applied in the on period. When the IGBT is in the on state, a voltage VG of +15 V is applied to the trench gate electrode G1. The second emitter potential applied to the trench gate electrode E2 is higher in absolute value than the first emitter potential applied to the trench gate electrode E1. That is, the second emitter potential is lower than the first emitter potential in the off period, and the second emitter potential is higher than the first emitter potential in the on period. In the off period, the second emitter potential is lower than the gate potential. The second emitter potential can be adjusted up to the gate maximum allowable voltage.

As a result of applying –15 V to the trench gate electrode E2 when the IGBT is turned off, a large inversion layer is formed in the channel of the parasitic PMOS. As illustrated in FIG. 4, the parasitic PMOS includes the P type latch-up prevention region LR, the N type hole barrier region HB, the P type floating region FR, and the trench gate electrode E2 as a gate. Even when the potential of the trench gate electrode E2 is, for example, 0 V, the parasitic PMOS is in the on state and discharges holes. On the other hand, here, as a result of applying –15 V to the trench gate electrode E2 when the IGBT is turned off, the parasitic PMOS is in a strong on state, and thus discharges holes more strongly than in the case where the potential of the trench gate electrode E2 is 0 V. As a result, the turn off of the IGBT can be speeded up. In this manner, the switching turn off loss of the IGBT can be reduced.

<Reduction of Switching Turn on Loss and Conduction Loss>

As a result of applying +15 V to the trench gate electrode E2 when the IGBT is turned on and conductive, the parasitic PMOS illustrated in FIG. 4 is in a completely off state. Therefore, since unnecessary hole discharge can be suppressed, the carrier accumulation effect can be enhanced, and the turn on speed can be increased. In this manner, the switching turn on loss of the IGBT can be reduced. In a case where the first emitter potential is applied to the trench gate electrode E2, the parasitic PMOS cannot be in the completely off state, holes are discharged, and the turn on cannot be speeded up as in the present embodiment.

Figures 5, 6:
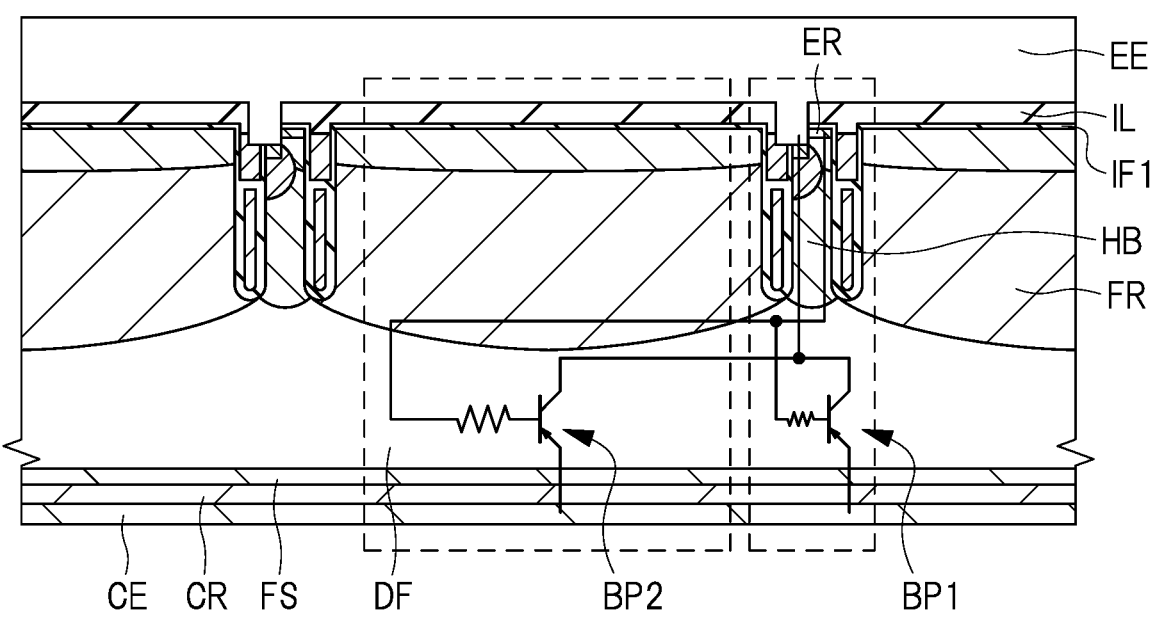
FIG. 5 is a cross-sectional view schematically illustrating a parasitic bipolar transistor in the semiconductor device according to the first embodiment.
FIG. 6 is a cross-sectional view schematically illustrating gate resistances connected to trench gate electrodes of the semiconductor device according to the first embodiment.

FIG. 5 is a cross-sectional view schematically illustrating a parasitic bipolar transistor in the IGBT according to the present embodiment. In the cell formation region of the IE type IGBT semiconductor device, a first parasitic PNP bipolar transistor BP1 and a second parasitic PNP bipolar transistor BP2 that operate in an on state (a state in which a positive voltage (for example, +15 V) is applied to the trench gate electrode G1, the collector and the emitter are electrically connected, and VCE (sat) is generated) are formed. In this manner, it can be considered that two parasitic bipolar transistors are connected in parallel between the emitter electrode EE and the collector electrode CE.

The first parasitic PNP bipolar transistor BP1 is formed in the active cell region 40a (refer to FIG. 1) and includes a collector region CR, an N type semiconductor region (drift region DF, hole barrier region HB, and emitter region ER), and a P+ type semiconductor region (body contact region BC and latch-up prevention region LR). The second parasitic PNP bipolar transistor BP2 is formed in the inactive cell region 40i (refer to FIG. 1) and includes a collector region CR, an N type semiconductor region (drift region DF, hole barrier region HB, and emitter region ER), and a P+ type semiconductor region (body contact region BC and latch-up prevention region LR).

An effective way to improve the IE effect is to increase the concentration of carriers (holes) accumulated in the drift region DF to lower the resistance of the drift region DF. In order to achieve this, it is necessary to enhance the functions of (activate) the first parasitic PNP bipolar transistor BP1 and the second parasitic PNP bipolar transistor BP2.

Here, the electron supply from the emitter region ER in the on state (a positive voltage (for example, +15 V) is applied to the trench gate electrode G1) is the base current supply to the first parasitic PNP bipolar transistor BP1 and the second parasitic PNP bipolar transistor BP2. Therefore, in order to enhance the functions of (activate) the first parasitic PNP bipolar transistor BP1 and the second parasitic PNP bipolar transistor BP2, it is necessary to sufficiently supply electrons to the transistors. However, the distance from the emitter region ER from which electrons are supplied to the second parasitic PNP bipolar transistor BP2 formed in the inactive cell region 40i is longer than the distance from the emitter region ER from which electrons are supplied to the first parasitic PNP bipolar transistor BP1 formed in the active cell region 40a. As a result, the base resistance of the second parasitic PNP bipolar transistor BP2 is higher than the base resistance of the first parasitic PNP bipolar transistor BP1, and a difference occurs in the electron current supply amount.

Therefore, even in a case where the width of the floating region FR is increased in order to lower the collector-emitter saturation voltage (VCE (sat)), the supply of the base current (electron current) of the second parasitic PNP bipolar transistor BP2 decreases when the width of the floating region FR is larger than a specific width. As a result, the function (activation) of the second parasitic PNP bipolar transistor BP2 is weakened, and the IE effect is lowered. Accordingly, the switching turn on loss and the conduction loss (collector-emitter saturation voltage (VCE (sat))) increase.

Therefore, in order to improve the IE effect, it is necessary to increase the base current (electron supply from the emitter) to the parasitic PNP bipolar transistor when viewed from the collector side. This parasitic PNP bipolar transistor can be seen separately in the active cell region 40a and the floating region of the inactive cell region.

In the present embodiment, the potential of the trench gate electrode E2 is controlled, and +15 V is applied to the trench gate electrode E2 when the IGBT is turned on and conductive. Electrons attracted to this potential and passing through the hole barrier region HB from the side provided with the emitter region ER diffuse into the side provided with the floating region FR (side provided with the second parasitic PNP bipolar transistor BP2). As a result, the supply of the base current to the second parasitic PNP bipolar transistor BP2 increases. By increasing the base current supply amount to the lower region of the floating region FR (the second parasitic PNP bipolar transistor BP2), the IE effect can be improved, and the switching turn on loss and the conduction loss can be reduced.

<Reduction of Switching Loss>

Figures 7, 8, 9:
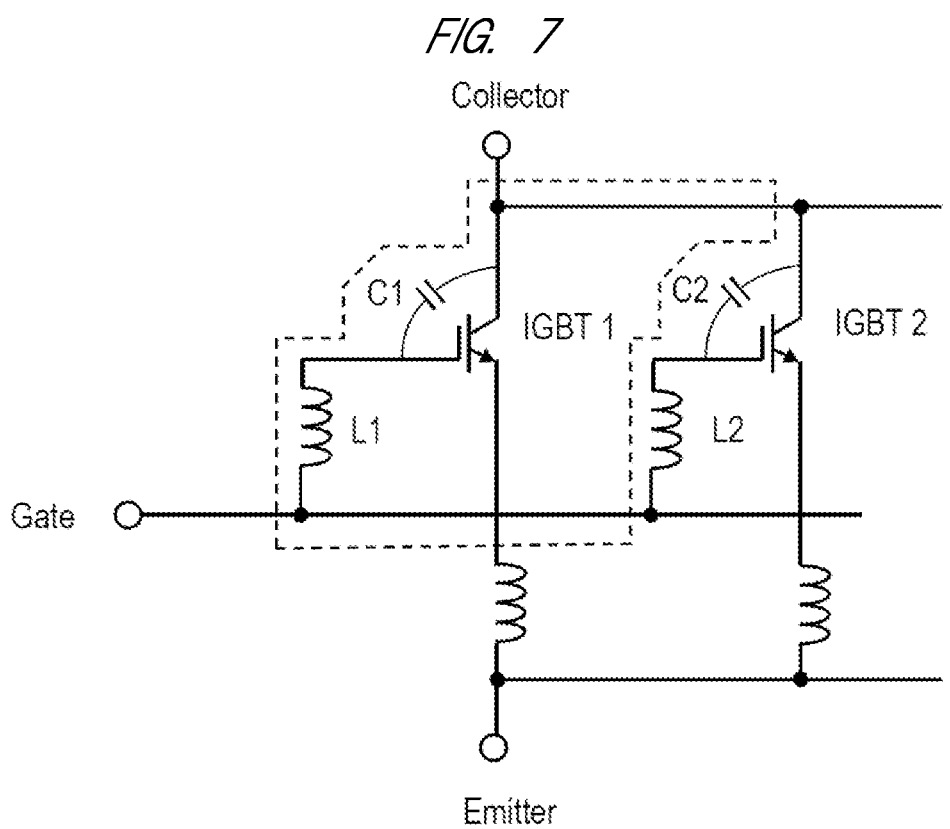
FIG. 7 is a circuit diagram illustrating a plurality of IGBTs connected in parallel.
FIG. 8 is an equivalent circuit diagram in a case where a damping resistance is inserted into a loop circuit.
FIG. 9 is an expression representing a resonance frequency.
Figures 10, 11:
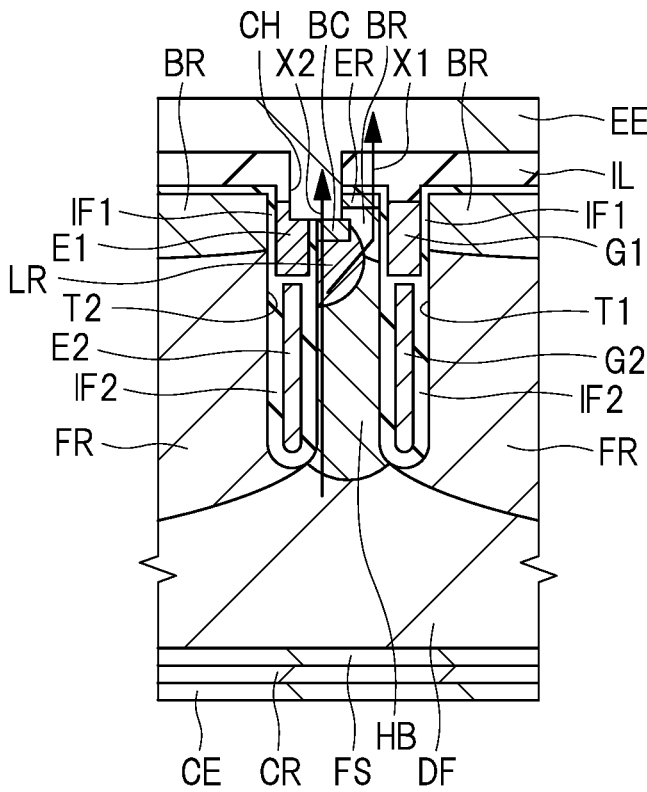
FIG. 10 is an expression representing a resonance condition.
FIG. 11 is a cross-sectional view illustrating a path through which carriers flow in the semiconductor device according to the first embodiment.

FIG. 6 is a cross-sectional view schematically illustrating gate resistances connected to the respective trench gate electrodes G1 and G2. FIG. 7 is a circuit diagram illustrating a plurality of IGBTs connected in parallel. FIG. 8 is an equivalent circuit diagram in a case where a damping resistance is inserted into a loop circuit. FIG. 9 is an expression representing a resonance frequency f. FIG. 10 is an expression representing a resonance condition Q.

As illustrated in FIG. 6, gate resistances are connected to the trench gate electrodes G1 and G2, respectively. The value of the gate resistance connected to the trench gate electrode G2 is higher than the value of the gate resistance connected to the trench gate electrode G1.

As illustrated in FIG. 7, when a plurality of (two in FIG. 7) IGBTs are connected in parallel, a loop circuit (broken line) is formed by parasitic capacitances (C1 and C2). The loop circuit also includes parasitic inductances (L1 and L2). When the loop circuit is formed by the parasitic capacitances and the parasitic inductances, a resonance phenomenon occurs. FIG. 8 illustrates an equivalent circuit in a case where a resistance (damping resistance) R for suppressing the resonance phenomenon is inserted into the loop circuit. The resonance frequency f and the resonance condition Q in the equivalent circuit are as illustrated in FIGS. 9 and 10.

When the resonance phenomenon occurs, the operation of the semiconductor device (IGBT chip) becomes unstable, so that it is desirable to suppress the resonance phenomenon. The resonance condition Q illustrated in FIG. 10 shows that the resonance phenomenon can be suppressed by increasing the resistance (damping resistance) R. In the case of the IGBT, since the gate resistance functions as the damping resistance, the resonance phenomenon can be suppressed by increasing the gate resistance. However, in a case where the gate resistance is simply increased, the switching operation of the IGBT is delayed. That is, it is necessary to determine the gate resistance in consideration of both suppression of the resonance phenomenon and reduction of the switching loss. In the present embodiment, the trench gate electrode having the gate potential is divided into two trench gate electrodes G1 and G2, so that both of them can be achieved.

That is, the IGBT has two trench gate electrodes G1 and G2. The upper trench gate electrode G1 has a larger contribution to the switching operation of the IGBT than the trench gate electrode G2. Therefore, a low gate resistance is connected to the trench gate electrode G1. Since the trench gate electrode G2 has a large contribution as a damping resistance, a high gate resistance is connected to the trench gate electrode G2. This makes it possible to achieve both suppression of the resonance phenomenon and reduction of the switching loss. For these gate resistances, for example, in a region not illustrated in FIG. 1, resistor elements formed by a pattern made of a polysilicon film provided on the semiconductor substrate are used.

As one of the features of the present embodiment, the film thickness of the insulating film IF2 separating the trench gate electrode G2 and the semiconductor substrate is larger than the film thickness of the insulating film IF1 separating the trench gate electrode G1 and the semiconductor substrate. As a result, as for the trench gate electrode G2, a gate feedback capacitance Cres (corresponding to parasitic capacitances C1 and C2 illustrated in FIG. 7) decreases. As a result, the value of the resonance condition Q also decreases. This seems to be not preferable from the viewpoint of suppressing oscillation. However, the resonance condition Q illustrated in FIG. 10 shows that the increase or decrease of the capacitance C has a smaller influence on the resonance condition Q than that of the resistance R. That is, controlling the resistance R (damping resistance) is more effective in suppressing the oscillation, and the influence of the insulating film IF2 thicker than the insulating film IF1 on the resonance increase and the switching loss is small. Therefore, even in a case where the gate feedback capacitance Cres decreases due to the thick insulating film IF2, the oscillation resistance can be improved, and the influence on the switching loss can be eliminated as long as the gate resistance is secured. That is, the switching loss can be reduced.

<Improvement in Breakdown Ruggedness>

FIG. 11 is a cross-sectional view illustrating a path through which carriers (holes) flow in the IGBT according to the present embodiment. As illustrated in FIG. 11, paths through which holes flow in the IGBT include a path X1 through which holes flow along the trench T1 by means of an N channel MOSFET (hereinbelow, referred to as an NMOS) having the trench gate electrode G1 as a gate, and a path X2 through which holes flow along the trench T2 by means of the parasitic PMOS having the trench gate electrode E2 as a gate. The NMOS includes, for example, the N type emitter region ER, the P type body region BR, the N type hole barrier region HB, and the trench gate electrode G1.

In the IGBT, holes concentrate on the side provided with the trench gate electrode G1 (path X1) due to the operation of the NMOS, which causes a problem of generation of a dynamic avalanche. When the current concentrates on the path X1, latch-up occurs. Therefore, by decreasing the number of holes passing through the path X1 and increasing the number of holes passing through the path X2, the generation of the dynamic avalanche near the trench T1 can be suppressed, and the latch-up can be prevented.

In the present embodiment, since the second emitter potential is supplied to the trench gate electrode E2 to strongly operate the parasitic PMOS, hole discharge through the path X2 can be enhanced. As a result, the concentration of the hole current in the path X1 is relaxed, the electric field intensity in the vicinity of the trench T1 is lowered, and the generation of the dynamic avalanche is suppressed. In addition, since the insulating film IF2 covering the side surface of the trench gate electrode G2 is thicker than the insulating film IF1 covering the side surface of the trench gate electrode G1, the electric field in the vicinity of the trench T1 can be relaxed, and the generation of the dynamic avalanche is further suppressed. Therefore, the breakdown ruggedness can be improved.

In addition, since the insulating film IF2 covering the side surface of the trench gate electrode G2 is thicker than the insulating film IF1 covering the side surface of the trench gate electrode G1, the electric field is relaxed, and the generation of the dynamic avalanche is suppressed. As a result, generation of hot carriers is suppressed. Therefore, the influence of the hot carriers can be reduced. As described with reference to FIG. 6, the value of the gate resistance connected to the trench gate electrode G2 is higher than the value of the gate resistance connected to the trench gate electrode G1. As a result, the turn off timing of the trench gate electrode G2 is delayed, and as a result, hot carrier injection into the trench T1 can be suppressed. That is, the hot carrier injection occurs at a time point when the dynamic avalanche is generated and the gate potential is negative. In the present embodiment, these occurs at different times. Accordingly, the reliability of the semiconductor device can be improved.

<Effects of Present Embodiment and Verification Thereof>

As described above, with the IGBT which is the semiconductor device according to the present embodiment, the effects of reduction of the switching turn off loss, reduction of the switching turn on loss and the conduction loss, reduction of the switching loss, and improvement in the breakdown ruggedness can mainly be obtained. Accordingly, the performance of the semiconductor device can be improved. Hereinbelow, the effects of the present embodiment and the verification thereof will be described with reference to FIGS. 29 and 30 and FIGS. 12 to 15.

Figure 29:
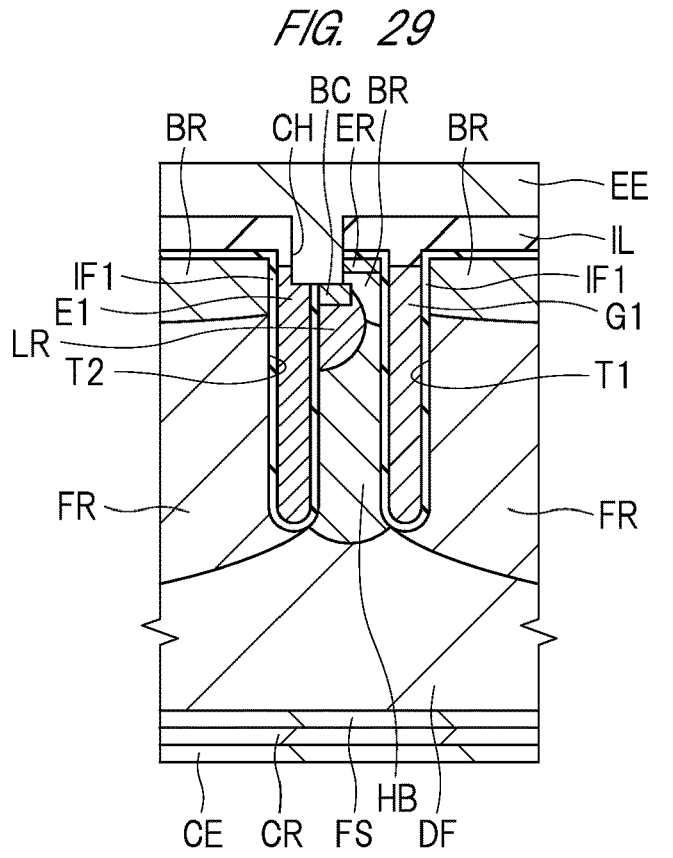
FIG. 29 is a cross-sectional view illustrating a semiconductor device according to a first comparative example.

FIG. 29 is a cross-sectional view illustrating an IGBT which is a semiconductor device according to a first comparative example. The IGBT according to the first comparative example is different from the IGBT according to the present embodiment in not including the trench gate electrodes G2 and E2. In the first comparative example, the trench gate electrode G1 is embedded in the trench T1 via the thin insulating film IF1, and the trench gate electrode E1 is embedded in the trench T2 via the thin insulating film IF1.

In such an IGBT, since the parasitic PMOS (refer to FIG. 4) generated on the side provided with the trench T2 has as a gate the trench gate electrode E1 to which the relatively low first emitter potential is applied, the hole discharge capability is low. Therefore, the IGBT has a problem that the switching turn off loss is large. In addition, since the absolute value of the first emitter potential is relatively low at the time of turn on, the ability to supply electrons to the side provided with the floating region FR is low, and the parasitic PMOS is not in a completely off state. Therefore, since the function of the second parasitic PNP bipolar transistor BP2 described with reference to FIG. 7 is weak, the switching turn on loss and the conduction loss are large.

In addition, in the first comparative example, in each of the trenches T1 and T2, in particular, the film thickness of the insulating film IF1 covering each of the lower parts of the trench gate electrodes G1 and E1 is relatively small, and the operation of the parasitic PMOS is weak. This causes a problem that the flow of holes tends to concentrate in the vicinity of the trench T1, the breakdown ruggedness is low, and a large number of hot carriers are generated.

Figure 30:
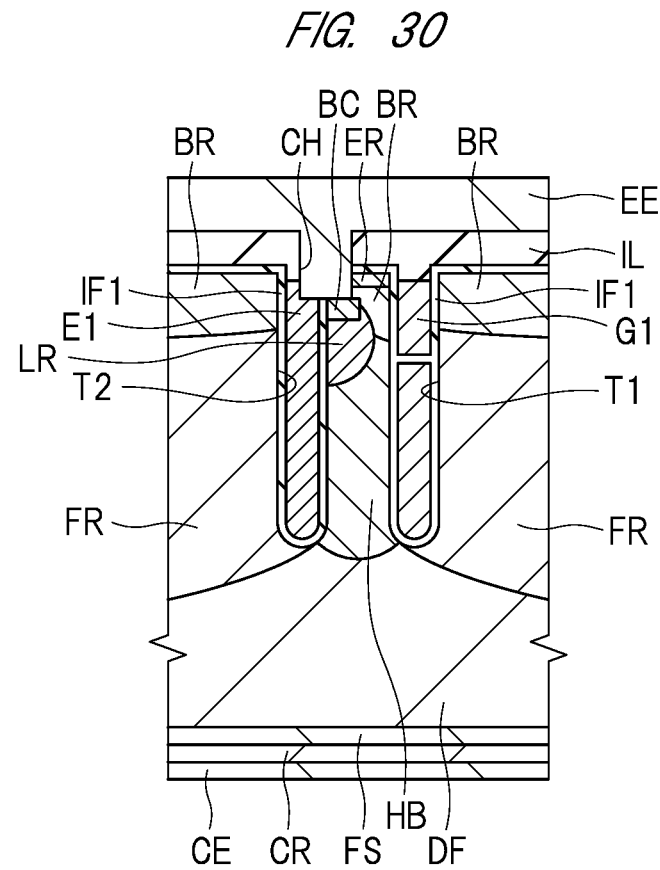
FIG. 30 is a cross-sectional view illustrating a semiconductor device according to a second comparative example.

FIG. 30 is a cross-sectional view illustrating an IGBT which is a semiconductor device of a second comparative example. In the second comparative example, in comparison with the first comparative example, the trench gate electrode G2 is provided below the trench gate electrode G1 in the trench T1. A gate potential is applied to both the trench gate electrodes G1 and G2. However, unlike the present embodiment, the film thickness of the insulating film IF1 separating the trench gate electrode G2 and the semiconductor substrate is as small as the film thickness of the insulating film IF1 separating the trench gate electrode G1 and the semiconductor substrate.

In such an IGBT, by providing the trench gate electrode G2, as described with reference to FIGS. 6 to 10, gate resistances of different values can be connected to the trench gate electrodes G1 and G2, respectively. As a result, switching turn on loss can be reduced while oscillation is suppressed, and switching of the element can be speeded up. In addition, the value of the gate resistance connected to the trench gate electrode G2 can be made higher than the value of the gate resistance connected to the trench gate electrode G1. Therefore, the time when the dynamic avalanche is generated and the time when the gate potential becomes negative can be different from each other, whereby the injection of hot carriers into the trench T1 can be prevented. However, the IGBT has similar problems to those of the IGBT according to the first comparative example except that switching turn on loss can be reduced while oscillation is suppressed and hot carrier injection can be suppressed.

On the other hand, in the semiconductor device according to the present embodiment, the effects of reduction of the switching turn off loss, reduction of the switching turn on loss and the conduction loss, reduction of the switching loss, and improvement in the breakdown ruggedness can be obtained.

Figure 12:
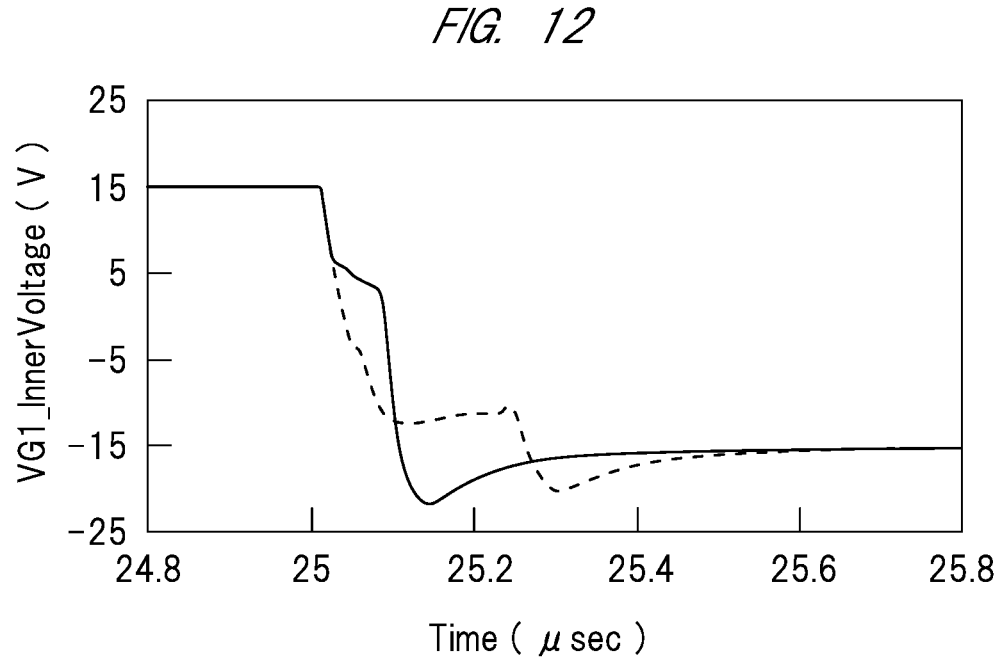
FIG. 12 is a graph of a switching turn off waveform illustrating a relationship between time and a gate potential.
Figure 13:
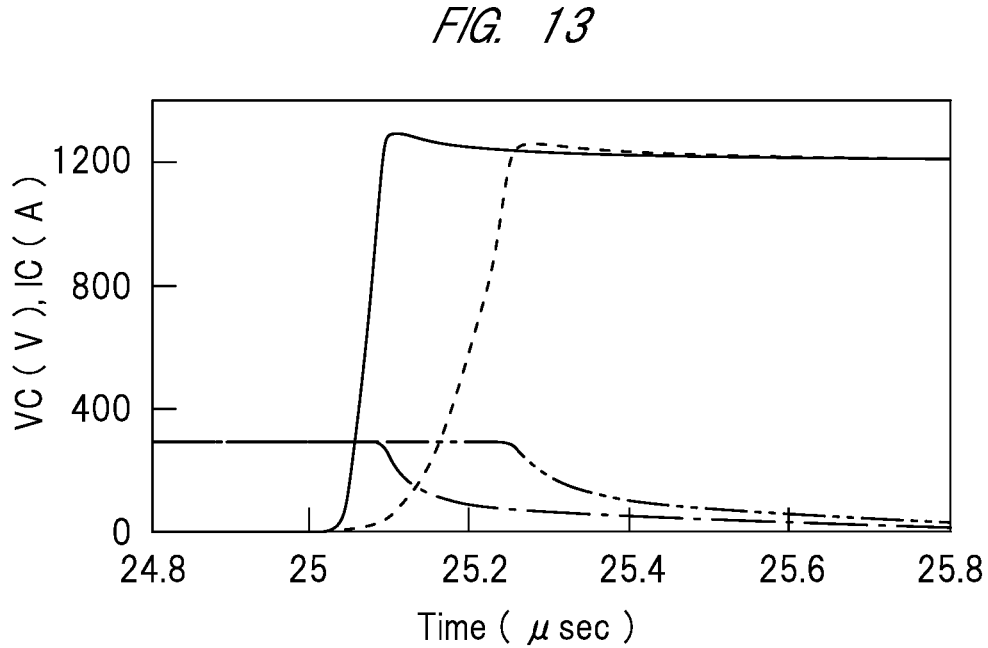
FIG. 13 is a graph of a switching turn off waveform illustrating a relationship between time, and a collector potential and a collector current.

That is, by applying the second emitter potential (−15 V) whose absolute value is higher than that of the first emitter potential to the trench gate electrode E2 when the IGBT is turned off, the switching turn off loss can be reduced. FIGS. 12 and 13 illustrate simulation results using a technology computer-aided design (TCAD) tool performed by the present inventor. FIG. 12 is a graph illustrating switching turn off waveforms with the horizontal axis representing time and the vertical axis representing the potential of the trench gate electrode G1. FIG. 13 is a graph illustrating switching turn off waveforms with the horizontal axis representing time and the vertical axis representing a collector potential and a collector current.

In FIGS. 12 and 13, the waveform of the potential when −15 V (second emitter potential) is applied to the trench gate electrode E2 at the time of turn off is indicated by a solid line, and the waveform of the potential when 0 V (first emitter potential) is applied is indicated by a broken line. In FIG. 13, the waveform of the current when −15 V (second emitter potential) is applied to the trench gate electrode E2 at the time of turn off is indicated by a one-dot chain line, and the waveform of the potential when 0 V (first emitter potential) is applied is indicated by a two-dot chain line. When the first emitter potential is applied to the trench gate electrode E2, similar characteristics to those of the first and second comparative examples are exhibited. Therefore, here, description will be provided regarding the waveforms of the broken lines and the two-dot chain line as characteristics of the IGBT according to any of the comparative examples.

When the potential of the trench gate electrode G1 is lowered, and the IGBT is turned off as illustrated in FIG. 12, it can be seen in FIG. 13 that the potential of the IGBT according to the present embodiment changes earlier and rises earlier than in the case of the IGBT according to the comparative example. In this manner, in the present embodiment, as described mainly with reference to FIG. 3, the switching turn off loss can be reduced to speed up the switching.

In addition, the inventor of the present invention has confirmed by simulation using a TCAD tool that the switching turn on loss can be reduced in the present embodiment further than in the first and second comparative examples. Therefore, the switching can be speeded up at the time of turn on as well.

Figure 14:
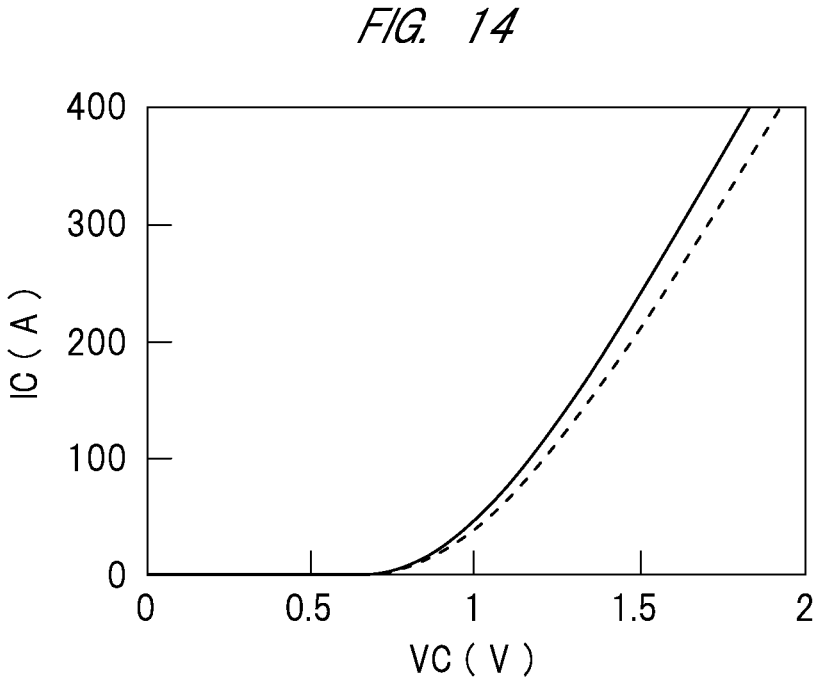
FIG. 14 is a graph illustrating a relationship between a collector potential and a collector current.

FIG. 14 is a graph in which the horizontal axis represents the collector potential and the vertical axis represents the collector current. In FIG. 14, the waveform when +15 V (second emitter potential) is applied to the trench gate electrode E2 in the on state is indicated by a solid line, and the waveform when 0 V (first emitter potential) is applied, that is, the waveform of the comparative example is indicated by a broken line. That is, in FIG. 14, it can be seen that the value of the collector voltage at the same collector current is lower and the conduction loss is smaller in the IGBT according to the present embodiment than in the comparative example.

In the IGBT, holes are injected from the back surface side of the semiconductor substrate, and the holes hardly exit from the inside of the semiconductor substrate due to the presence of the floating region FR. As a result, carriers accumulate in the semiconductor substrate, conductivity modulation occurs, and the resistance value to the flow of holes decreases. In a case where the width (mesa width) of the active cell region 40a is increased, the hole restriction factor Rhd (ease of accumulation of holes) increases, and the conduction loss can be reduced, but the density of the IGBT element decreases. In the present embodiment, the conduction loss can be reduced by applying the emitter potential to the trench gate electrode E2 without changing the width. That is, as described with reference to FIGS. 4 and 5, the switching turn on loss and the conduction loss can be reduced.

Figure 15:
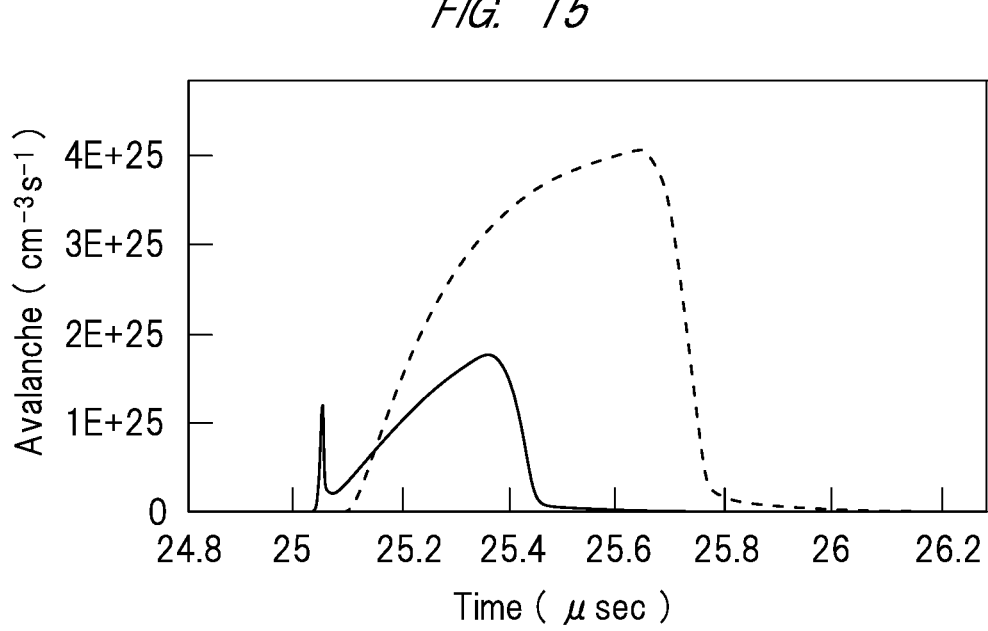
FIG. 15 is a graph illustrating the generation amount of a dynamic avalanche at the time of switching turn off.

FIG. 15 is a graph in which the horizontal axis represents time and the vertical axis represents the generation amount of the dynamic avalanche. That is, the graph is a graph illustrating the generation amount of the dynamic avalanche at the time of switching turn off. In FIG. 15, the waveform when −15 V (second emitter potential) is applied to the trench gate electrode E2 in the off state is indicated by a solid line, and the waveform when 0 V (first emitter potential) is applied, that is, the waveform of the comparative example is indicated by a broken line. The portion where the generation amount of the dynamic avalanche is measured is a portion in the vicinity of the trench T1 in the semiconductor substrate immediately below the trench T1 illustrated in FIG. 2. As can be seen from FIG. 15, in the present embodiment, the generation amount of the dynamic avalanche at the time of switching turn off can be reduced further than in the comparative example. That is, as described with reference to FIG. 11, the breakdown ruggedness can be improved by suppressing the generation of the dynamic avalanche.

As described above, in the present embodiment, the performance of the semiconductor device can be improved. (Summary)

An outline of the semiconductor device according to the embodiment will be described. Note that the elements in parentheses are examples.

The semiconductor device includes (a) a semiconductor substrate having a first main surface (front surface) and a second main surface (back surface) opposite to the first main surface (front surface), (b) a first semiconductor region (N⁻ type drift region) of a first conductivity type (N type) provided in the semiconductor substrate, (c) a second semiconductor region (body region) of a second conductivity type (P type) different from the first conductivity type (N type) provided in the semiconductor substrate between the first semiconductor region (N⁻ type drift region) and the first main surface (front surface), (d) a third semiconductor region (collector region) of the second conductivity type (P type) provided in the semiconductor substrate between the first semiconductor region (N⁻ type drift region) and the second main surface (back surface), (e) a first trench (gate trench) penetrating the second semiconductor region (body region), (f) a second trench (emitter trench) penetrating the second semiconductor region (body region) and provided to be away from the first trench (gate trench), (g) a fourth semiconductor region (N⁺ emitter region) of the first conductivity type (N type) provided on a side provided with the first main surface in the second semiconductor region (body region) so as to be in contact with a first side surface of the first trench (gate trench) and located between the first trench (gate trench) and the second trench (emitter trench), (h) a first trench electrode (first trench gate electrode) provided inside the first trench (gate trench) via a first insulating film, (i) a second trench electrode (first trench emitter electrode) provided inside the second trench (emitter trench) via a second insulating film, (j) a third trench electrode (second trench gate electrode) provided inside the first trench (gate trench) via a third insulating film and located between the first trench electrode (first trench gate electrode) and the second main surface, (k) a fourth trench electrode (second trench emitter electrode) provided inside the second trench (emitter trench) via a fourth insulating film and located between the second trench electrode (first trench emitter electrode) and the second main surface, (l) a fifth semiconductor region (P type floating region) of the second conductivity type (P type) formed in the first semiconductor region in a portion located opposite to the fourth semiconductor region (N⁺ emitter region) with the first trench (gate trench) interposed therebetween, (m) a sixth semiconductor region (P type floating region) of the second conductivity type (P type) formed in the first semiconductor region (N⁻ type drift region) in a portion located opposite to the fourth semiconductor region (N⁺ emitter region) with the second trench (emitter trench) interposed therebetween, and (n) a contact hole (contact groove) in contact with the second trench (emitter trench) and the fourth semiconductor region (N⁺ emitter region).

In the present embodiment, two trench gate electrodes having a gate potential are provided in the trench, and a trench gate electrode having a first emitter potential and a trench gate electrode having a second emitter potential below the trench gate electrode are provided in the emitter trench. As a result, the effects of reduction of the switching turn off loss, reduction of the switching turn on loss and the conduction loss, reduction of the switching loss, and improvement in the breakdown ruggedness can be obtained.

First Modification Example

Figure 16:
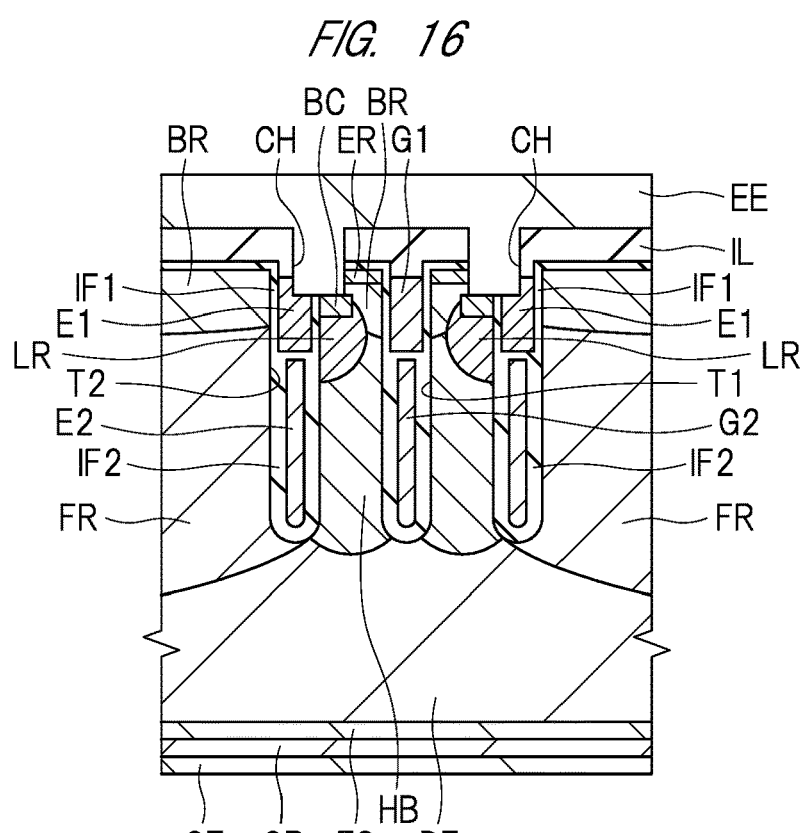
FIG. 16 is a cross-sectional view illustrating a semiconductor device according to a modification example of the first embodiment.

The present embodiment is applicable not only to the GE-S type IGBT but also to the EGE type IGBT. FIG. 16 is a cross-sectional view of an EGE type IGBT according to the present modification example.

The EGE type IGBT is different from the GE-S type IGBT described with reference to FIGS. 1 and 2 in that two trenches T2 are provided with the trench T1 interposed therebetween between the adjacent inactive cell regions 40i. That is, the EGE type IGBT includes a structure including the trenches T1 and T2 and the active cell region 40a illustrated in FIG. 2, and a structure line-symmetric to the structure across the center of the trench T1. That is, a trench T2 including the insulating films IF1 and IF2 and the trench gate electrodes E1 and E2 is further provided in the floating region FR provided on a side of the trench T1 which is the opposite side of the trench T2. The hole barrier region HB, the latch-up prevention region LR, the body region BR, the body contact region BC, and the emitter region ER are formed between each of the two trenches T2 with the trench T1 interposed therebetween and the trench T1.

Such a structure is called an EGE type IGBT because the trench gate electrode E1 to which the first emitter potential is applied, the trench gate electrode G1 to which the gate potential is applied, and the trench gate electrode E1 to which the first emitter potential is applied are arranged in this order.

The EGE type IGBT can perform switching at higher speed than the GE-S type IGBT. The EGE type IGBT is considered to have lower oscillation resistance than the GE-S type IGBT. However, in the present embodiment, the oscillation resistance can be improved by ensuring a high value of the gate resistance connected to the trench gate electrode G2.

In addition, since the number of parasitic PMOSs formed in the unit cell region is twice as large as that of the GE-S type IGBT, the turn off speed can further be increased.

Also, it is considered that the conduction loss increases in the EGE type IGBT further than in the GE-S type IGBT. However, in the present modification example, the electron diffusion capability can be improved by independently controlling the potential of the trench gate electrode E2, whereby the conduction loss can be reduced.

Second Embodiment

Figure 17:
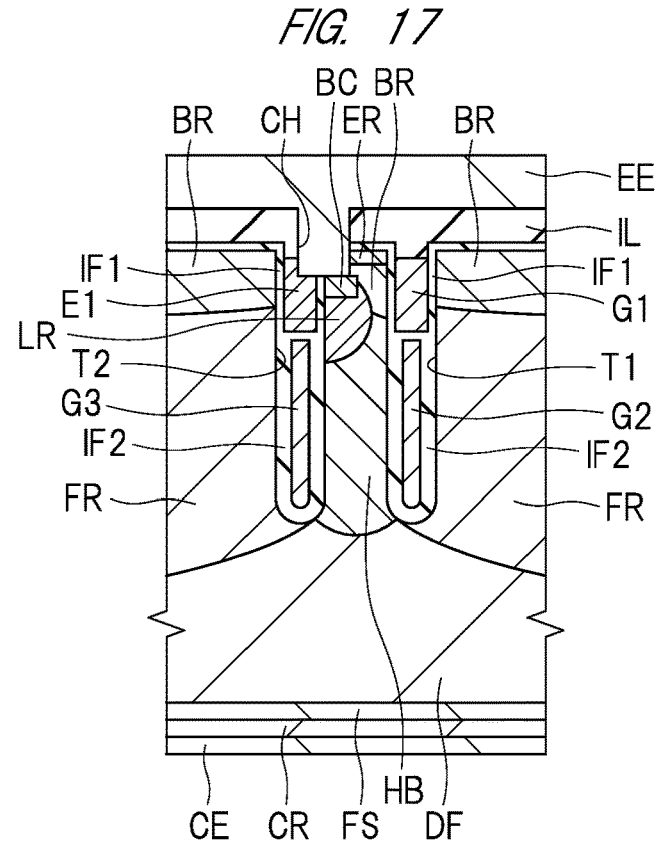
FIG. 17 is a cross-sectional view illustrating a main part of a semiconductor device according to a second embodiment.
Figure 18:
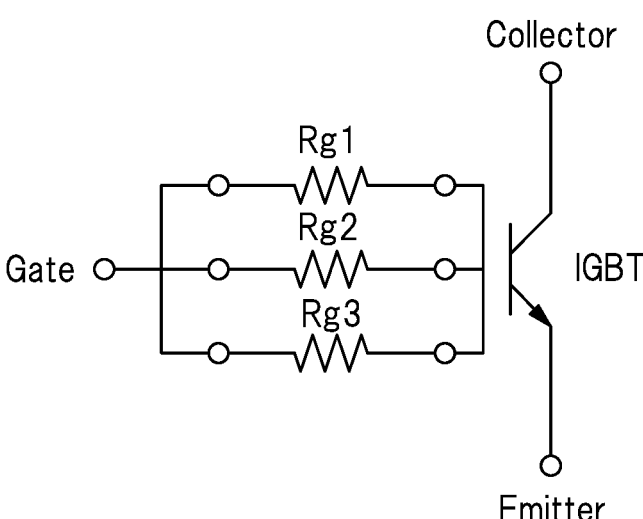
FIG. 18 is an equivalent circuit diagram of the semiconductor device according to the second embodiment.
Figure 19:
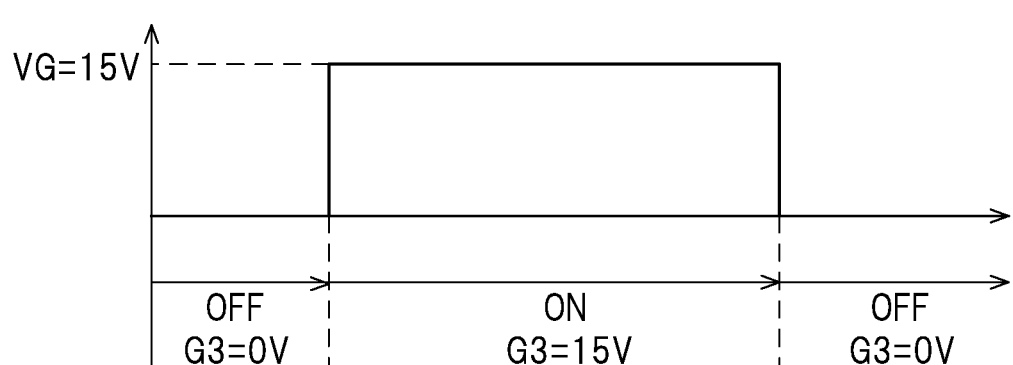
FIG. 19 is a timing chart illustrating a potential of a trench gate electrode in the semiconductor device according to the second embodiment.

In the first embodiment, the IGBT which is a four-terminal element has been described. Hereinbelow, an IGBT which is a three-terminal element will be described with reference to FIGS. 17 to 19. FIG. 17 is a cross-sectional view illustrating a main part of an IGBT according to the present embodiment. FIG. 18 is an equivalent circuit diagram illustrating the IGBT according to the present embodiment. FIG. 19 is a timing chart illustrating a potential (gate potential) of a trench gate electrode G3 and a potential (gate potential) of the trench gate electrode G1 according to the present embodiment.

As illustrated in FIG. 17, in the IGBT according to the present embodiment, the structure in the cross-sectional view is similar to the structure illustrated in FIGS. 1 and 2, but a trench gate electrode G3 to which the gate potential is applied is provided in the trench T2 instead of the trench gate electrode E2 (refer to FIG. 2) to which the second emitter potential is applied.

As illustrated in FIG. 18, a gate resistance Rg1 connected to the trench gate electrode G1, a gate resistance Rg2 connected to the trench gate electrode G2, and a gate resistance Rg3 connected to the trench gate electrode G3 are connected to the gate of the IGBT. The gate resistances Rg1, Rg2, and Rg3 are different resistances, and their values are different from each other. Here, the magnitude relationship among the values of the gate resistances is Rg3<Rg1<Rg2.

FIG. 19 illustrates a transition state in order of an off period, an on period (conduction period), and an off period of the IGBT as time passes. To the trench gate electrode G3, 0 V is applied in the off period, and +15 V is applied in the on period. The same applies to the trench gate electrode G1. As can be seen in FIG. 19, the trench gate electrodes G1 and G3 operate at the same time. Therefore, the effect of suppressing hot carrier injection into the trench T1 is lower than that in the first embodiment. However, by connecting the gate resistance Rg3 lower than the gate resistance Rg1 to the trench gate electrode G3, the parasitic PMOS can be operated at a higher speed than the NMOS. In addition, since the potential of the trench gate electrode G3 is 0 V at the time of switching turn off, the operation of the parasitic PMOS is weak, and the hole discharge capability on the side provided with the trench T2 is lower than that in the first embodiment.

In the IGBT according to the present embodiment, the trench gate electrodes G1 and G3 are electrically connected to have the same potential. Therefore, the IGBT according to the present embodiment is a three-terminal element in which the number of terminals that require independent voltage control is reduced as compared with the first embodiment. Therefore, since one gate driver can be reduced as compared with the first embodiment, there is an advantage that the control of the elements can be simplified.

First Modification Example

Figure 20:
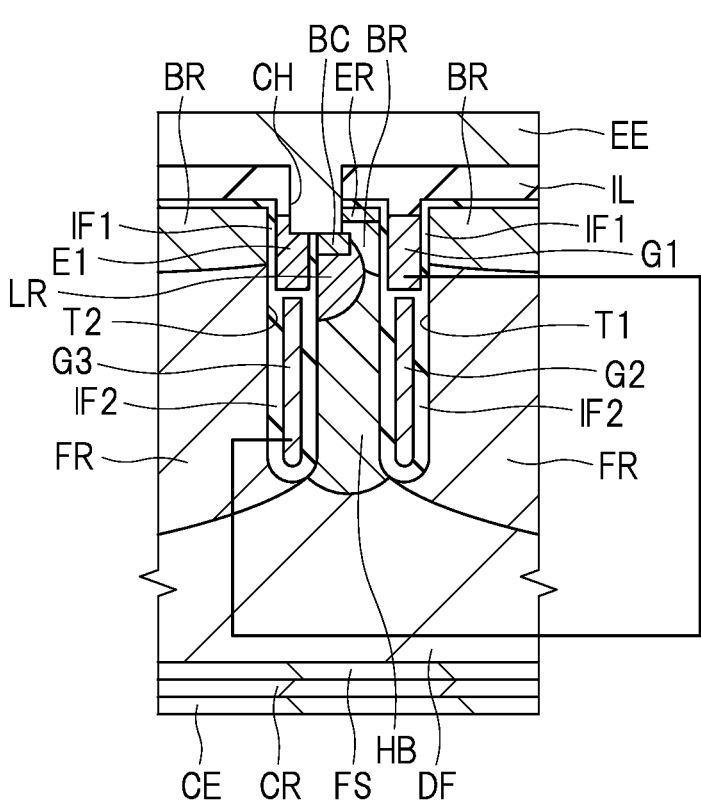
FIG. 20 is a cross-sectional view illustrating a main part of a semiconductor device according to a first modification example of the second embodiment.
Figure 21:
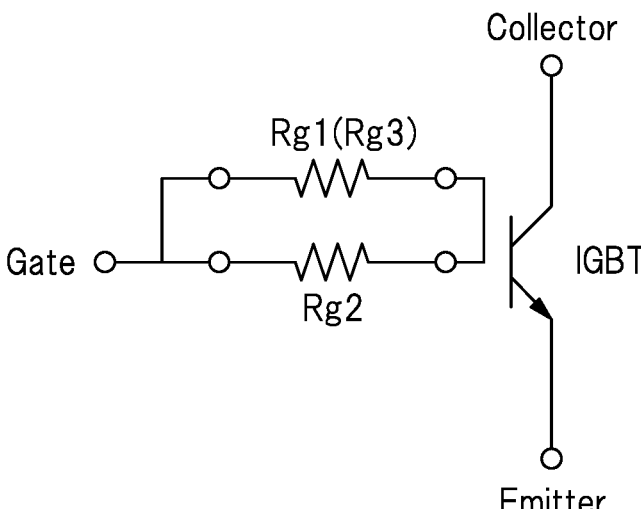
FIG. 21 is an equivalent circuit diagram of the semiconductor device according to the first modification example of the second embodiment.
Figure 22:
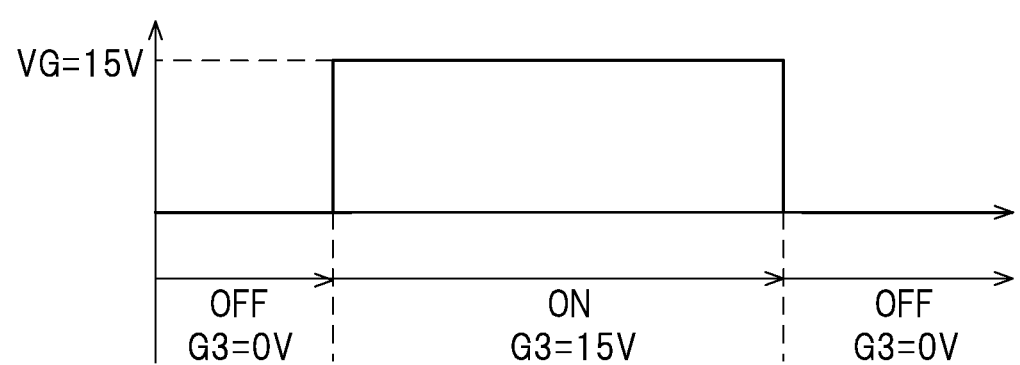
FIG. 22 is a timing chart illustrating a potential of a trench gate electrode in the semiconductor device according to the first modification example of the second embodiment.

An IGBT which is a three-terminal element according to a first modification example of the second embodiment will be described below with reference to FIGS. 20 to 21. FIG. 20 is a cross-sectional view illustrating a main part of an IGBT according to the present modification example. FIG. 21 is an equivalent circuit diagram illustrating the IGBT according to the present modification example. FIG. 22 is a timing chart illustrating a potential (gate potential) of the trench gate electrode G3 and a potential (gate potential) of the trench gate electrode G1 according to the present modification example.

As illustrated in FIG. 20, the structure of the IGBT according to the present modification example is similar to the structure of the IGBT described with reference to FIG. 17. However, the IGBT is different from the IGBT described with reference to FIG. 17 in that the trench gate electrode G1 is electrically connected to the trench gate electrode G3, and gate resistances connected to the trench gate electrodes G1 and G3 are common. That is, as illustrated in FIG. 21, the gate resistance Rg1 is commonly connected to the trench gate electrodes G1 and G3, and the gate resistance Rg2 is connected to the trench gate electrode G2. Here, the gate resistance Rg1 is synonymous with the gate resistance Rg3. In this case, the magnitude relationship among the values of the gate resistances is Rg3=Rg1<Rg2.

As illustrated in FIG. 22, to the trench gate electrode G3, 0 V is applied in the off period, and +15 V is applied in the on period. The same applies to the trench gate electrode G1. As can be seen in FIG. 22, the trench gate electrodes G1 and G3 operate at the same time. Therefore, the effect of suppressing hot carrier injection into the trench T1 is lower than that in the first embodiment. However, since only two types of gate resistances, that is, the gate resistance Rg1 (Rg3) and the gate resistance Rg2, are required to be provided, the density of the IGBT element can be increased and the chip size can be reduced.

In addition, since the value of the gate resistance Rg3 (Rg1) connected to the trench gate electrode G3 is higher than that in the structure described with reference to FIG. 17, the oscillation resistance is improved.

Second Modification Example

Figure 24:
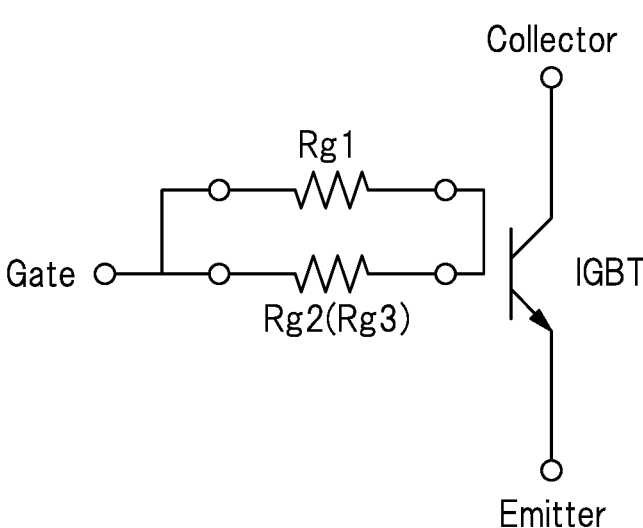
FIG. 24 is an equivalent circuit diagram of the semiconductor device according to the second modification example of the second embodiment.
Figure 25:
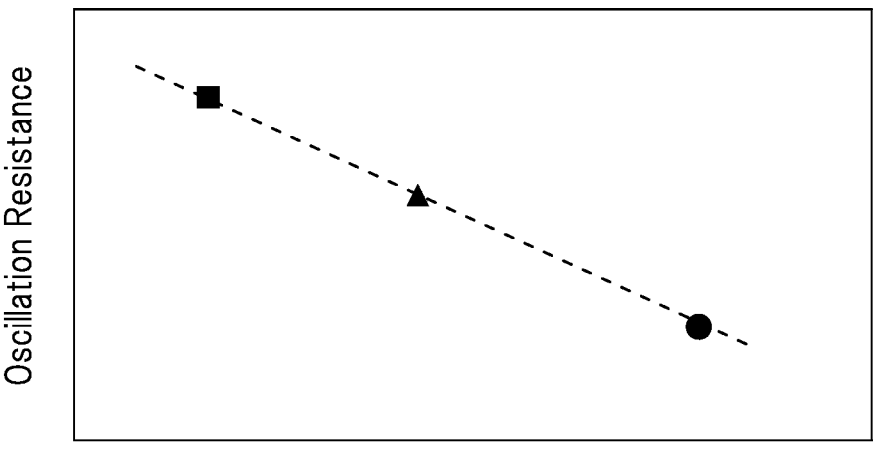
FIG. 25 is a graph illustrating a relationship between performance and oscillation resistance in the second embodiment.

An IGBT which is a three-terminal element according to a second modification example of the second embodiment will be described below with reference to FIGS. 24 and 25. FIG. 24 is a cross-sectional view illustrating a main part of an IGBT according to the present modification example. FIG. 25 is an equivalent circuit diagram illustrating the IGBT according to the present modification example.

The structure of the IGBT according to the present modification example is similar to the structures of the IGBTs described with reference to FIGS. 17 and 20. However, the IGBT is different from the IGBTs described with reference to FIGS. 17 and 20 in that the trench gate electrode G2 is electrically connected to the trench gate electrode G3, and gate resistances connected to the trench gate electrodes G2 and G3 are common. That is, as illustrated in FIG. 24, the gate resistance Rg1 is connected to the trench gate electrode G1, and the gate resistance Rg2 is commonly connected to the trench gate electrodes G2 and G3. Here, the gate resistance Rg2 is synonymous with the gate resistance Rg3. In this case, the magnitude relationship among the values of the gate resistances is Rg3=Rg2 >Rg1.

The trench gate electrodes G2 and G3 operate at the same time. Therefore, the effect of suppressing hot carrier injection into the trench T1 is lower than that in the first embodiment. The effect obtained in the present modification example is only the effect of reduction of the conduction loss described with reference to FIG. 5 out of the effects described in the first embodiment. However, since only two types of gate resistances, that is, the gate resistance Rg2 (Rg3) and the gate resistance Rg1, are required to be provided, the density of the IGBT element can be increased and the chip size can be reduced.

In addition, since the value of the gate resistance Rg3 (Rg2) connected to the trench gate electrode G3 is higher than that in the structure of the second modification example described with reference to FIG. 20, the oscillation resistance is improved.

Figure 23:
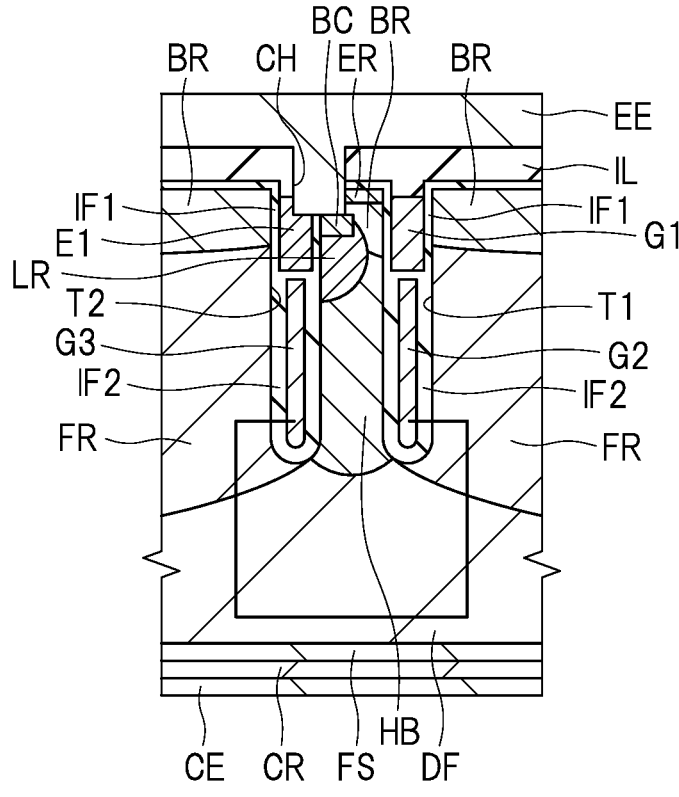
FIG. 23 is a cross-sectional view illustrating a main part of a semiconductor device according to a second modification example of the second embodiment.

Here, FIG. 25 is a graph illustrating a relationship between performance (speed of switching operation) and oscillation resistance of the examples of the present embodiment and the first and second modification examples. The horizontal axis of the graph represents performance (speed of switching operation) of the IGBT, and the vertical axis represents the level of oscillation resistance of the IGBT. In FIG. 25, the characteristic of the IGBT according to the embodiment described with reference to FIGS. 17 to 19 is plotted by a circle, the characteristic of the IGBT according to the first modification example described with reference to FIGS. 20 to 22 is plotted by a triangle, and the characteristic of the IGBT described with reference to FIGS. 23 and 24 is plotted by a square.

As illustrated in FIG. 25, the switching performance and the oscillation resistance of the IGBT are in a trade-off relationship. These three types of IGBTs can appropriately be selected depending on the application.

Third Embodiment

Figure 26:
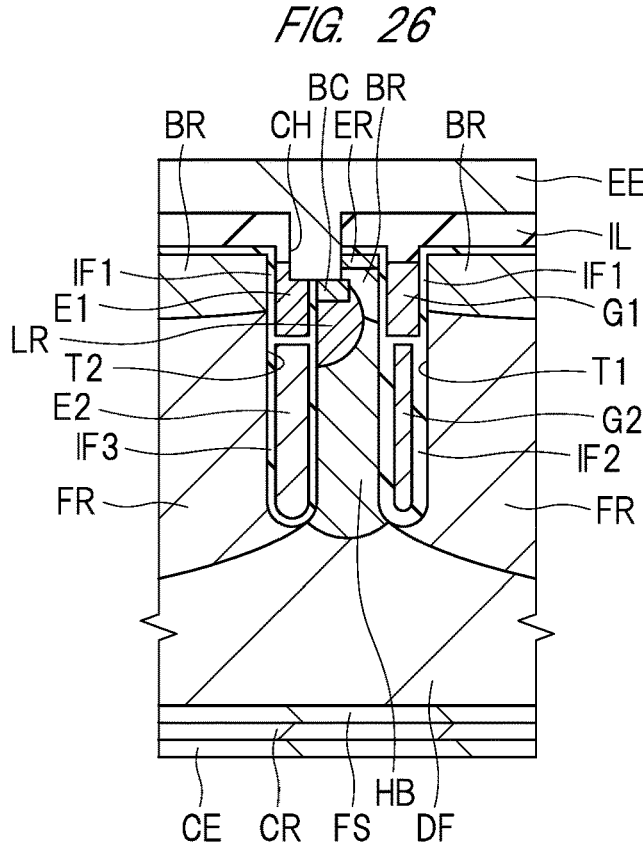
FIG. 26 is a cross-sectional view illustrating a main part of a semiconductor device according to a third embodiment.

An IGBT which is a semiconductor device according to a third embodiment will be described below with reference to FIG. 26. FIG. 26 is a cross-sectional view illustrating a main part of an IGBT according to the present embodiment. This IGBT is different from the first embodiment in that the film thickness of an insulating film IF3 separating the trench gate electrode E2 to which the second emitter potential is applied and the semiconductor substrate in the trench T2 is smaller than the film thickness of the insulating film IF2 illustrated in FIG. 2. The thickness of the insulating film IF3 is equal to the thickness of the insulating film IF1. That is, the insulating film IF3 between the trench gate electrode E2 and the trench T1 is smaller in thickness than the insulating film IF2 between the trench gate electrode G2 and the trench T2.

Since the film thickness of the insulating film IF3 between the inner wall of the trench T2 and the trench gate electrode E2 is smaller than that in the first embodiment, controllability of the parasitic PMOS (refer to FIG. 4) is improved. However, since the film thickness of the insulating film IF3 is small, the electric field intensity is raised. Even in this case, in the trench T2, to which the first emitter potential and the second emitter potential are applied, the influence of hot carriers, if any, does not cause characteristic changes. The reason for this is that the IGBT is not controlled by the emitter potential.

In the present embodiment, since the film thickness of the insulating film IF3 is small, the dynamic avalanche is actively generated on the side provided with the trench T2, thereby clamping the voltage. That is, in a case where a large dynamic avalanche is generated on the side provided with the trench T2 different from the trench T1 including the trench gate electrodes G1 and G2 to which the gate potential is applied, the dynamic avalanche on the side provided with the trench T1 can be suppressed, that is, the surge can be reduced. As a result, the electric field intensity in the vicinity of the trench T1 can be relaxed, and the operation of the IGBT can be stabilized.

Similar effects to those of the first embodiment can be obtained except that the electric field intensity in the vicinity of the trench T2 is lowered.

Fourth Embodiment

Figure 27:
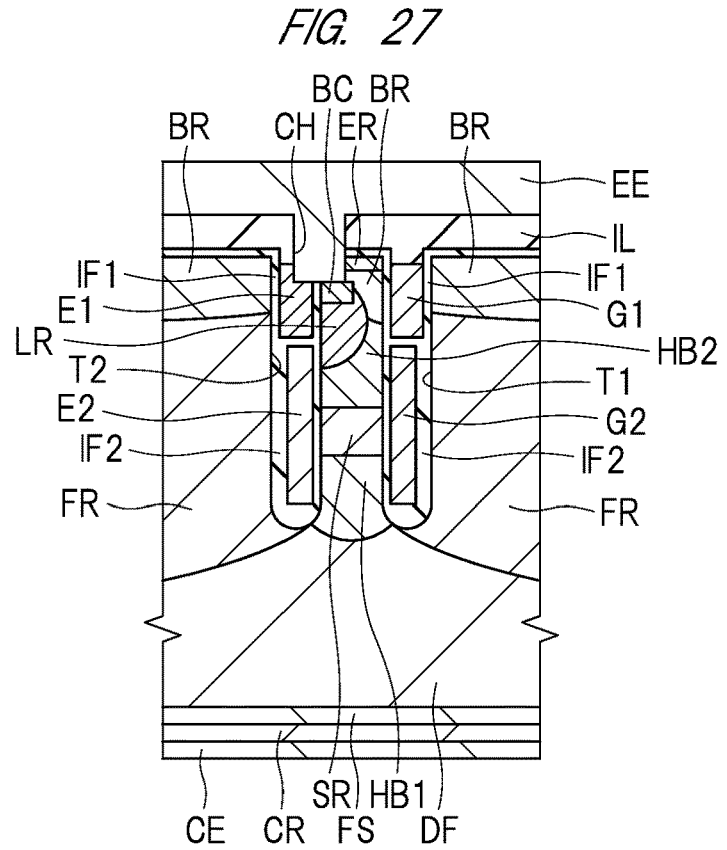
FIG. 27 is a cross-sectional view illustrating a main part of a semiconductor device according to a fourth embodiment.

An IGBT which is a semiconductor device according to a fourth embodiment will be described below with reference to FIG. 27. FIG. 27 is a cross-sectional view illustrating a main part of an IGBT according to the present embodiment. This IGBT is a channel two-stage control type IGBT having a second channel layer. That is, in the IGBT illustrated in FIG. 27, a P type semiconductor region SR is formed in the semiconductor substrate so as to divide the hole barrier region HB illustrated in FIG. 2 in the up-down direction. Here, between the trenches T1 and T2, an N type hole barrier region HB1, the P type semiconductor region SR, and an N type hole barrier region HB2 are formed in order from the back surface side to the front surface side of the semiconductor substrate. In other words, in the region interposed between the adjacent trenches T1 and T2, the hole barrier region HB2, the semiconductor region SR, and the hole barrier region HB1 are formed between the body region BR and the back surface of the semiconductor substrate in order from the side provided with the body region BR. The hole barrier regions HB1 and HB2 and the semiconductor region SR are formed from the side surface of the trench T1 to the side surface of the trench T2.

Unlike the first embodiment, each of the trench gate electrodes G2 and E2 is formed close to a region interposed between the trenches T1 and T2 in order to form a channel in the semiconductor region SR. That is, the thickness of the insulating film IF2 between the semiconductor region SR and the trench gate electrode G2 adjacent to each other is smaller than the thickness of the insulating film IF2 between the floating region FR and the trench gate electrode G2 adjacent to each other. Also, the thickness of the insulating film IF2 between the semiconductor region SR and the trench gate electrode E2 adjacent to each other is smaller than the thickness of the insulating film IF2 between the floating region FR and the trench gate electrode E2 adjacent to each other. Therefore, the breakdown ruggedness is lower, and the reliability is lower than in the first embodiment.

Here, the withstand voltage can be maintained by the semiconductor region SR, which is the second channel layer. As a result, the concentration in the hole barrier region HB2 on the semiconductor region SR can be increased. That is, the impurity concentration in the hole barrier region HB2 is higher than the impurity concentration in the hole barrier region HB1. By increasing the concentration, the concentration of electrons increases, so that the IE effect can be improved.

Also, the gate resistance connected to the trench gate electrode G2 is higher than the gate resistance connected to the trench gate electrode G1. Therefore, the NMOS in which the trench gate electrode G2 is used as a gate and a channel is formed in the semiconductor region SR performs an on/off operation at a later time than the NMOS operated using the trench gate electrode G2 as a gate. Therefore, a rapid switching operation can be suppressed.

Modification Example

Figure 28:
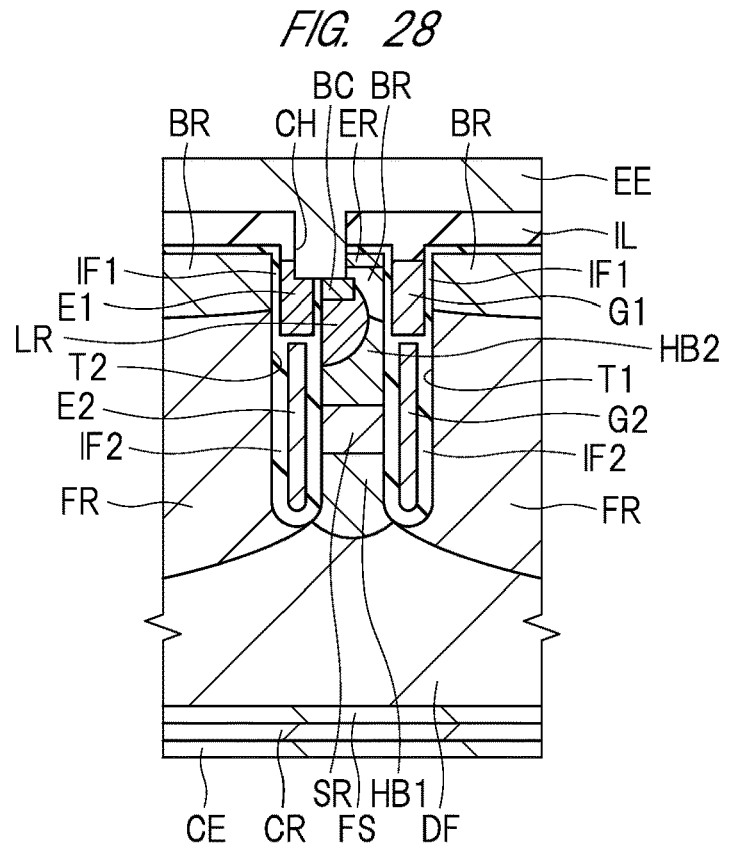
FIG. 28 is a cross-sectional view illustrating a main part of a semiconductor device according to a modification example of the fourth embodiment.

In the case of forming the semiconductor region SR, as illustrated in FIG. 28, the internal structure of each of the trenches T1 and T2 may be the same as that in the first embodiment. That is, the thickness of the insulating film IF2 between the semiconductor region SR and each of the trench gate electrodes G2 and E2 may be larger than the thickness of the insulating film IF1. Here, by adjusting the impurity concentration in the semiconductor region SR, the NMOS having the semiconductor region SR as the channel formation region can be operated even in a case where the insulating film IF2 is formed to be uniformly thick.

In the present modification example, the manufacturing process can be simplified and the breakdown ruggedness and reliability can be improved as compared with the structure illustrated in FIG. 27.

Although the invention made by the present inventor has been specifically described on the basis of the embodiments, the present invention is not limited to the above embodiments, and it goes without saying that various modifications can be made without departing from the gist of the present invention.

For example, an embodiment may be combined with a modification example of another embodiment. In addition, embodiments or modification examples may be combined. The polarities of the components of the IGBT described in the first to fourth embodiments may be interchanged.

What is claimed is:
1. A semiconductor device comprising:
a semiconductor substrate having a first main surface and a second main surface opposite to the first main surface;
a first semiconductor region of a first conductivity type provided in the semiconductor substrate;
a second semiconductor region of a second conductivity type different from the first conductivity type provided in the semiconductor substrate between the first semiconductor region and the first main surface;

a third semiconductor region of the second conductivity type provided in the semiconductor substrate between the first semiconductor region and the second main surface;
a first trench penetrating the second semiconductor region;
a second trench penetrating the second semiconductor region and provided to be away from the first trench;
a fourth semiconductor region of the first conductivity type provided on a side provided with the first main surface in the second semiconductor region so as to be in contact with a first side surface of the first trench and located between the first trench and the second trench;
a first trench electrode provided inside the first trench via a first insulating film;
a second trench electrode provided inside the second trench via a second insulating film;
a third trench electrode provided inside the first trench via a third insulating film and located between the first trench electrode and the second main surface;
a fourth trench electrode provided inside the second trench via a fourth insulating film and located between the second trench electrode and the second main surface;
a fifth semiconductor region of the second conductivity type formed in the first semiconductor region in a portion located opposite to the fourth semiconductor region with the first trench interposed therebetween;
a sixth semiconductor region of the second conductivity type formed in the first semiconductor region in a portion located opposite to the fourth semiconductor region with the second trench interposed therebetween; and
a contact hole in contact with the second trench and the fourth semiconductor region.
2. The semiconductor device according to claim 1, wherein a fourth potential applied to the fourth trench electrode is lower than a first potential applied to the first trench electrode and a second potential applied to the second trench electrode when the semiconductor device is off.
3. The semiconductor device according to claim 1, wherein a fourth potential applied to the fourth trench electrode is higher than a second potential applied to the second trench electrode when the semiconductor device is on.
4. The semiconductor device according to claim 1, wherein the fourth insulating film between the fourth trench electrode and the first trench is larger in thickness than the second insulating film between the second trench electrode and the first trench.
5. The semiconductor device according to claim 1, wherein the third insulating film between the third trench electrode and the second trench is larger in thickness than the first insulating film between the first trench electrode and the second trench.
6. The semiconductor device according to claim 1, wherein a third gate resistance connected to the third trench electrode is higher than a first gate resistance connected to the first trench electrode.
7. The semiconductor device according to claim 1, wherein the second trench including the second insulating film, the second trench electrode, the fourth insulating film, and the fourth trench electrode is further provided between the first trench and the fifth semiconductor region, wherein the first trench is interposed between the two second trenches, and wherein the fourth semiconductor region is formed between each of the two second trenches and the first trench.

8. The semiconductor device according to claim 6, wherein an equal gate potential is applied to the first trench electrode and the fourth trench electrode, and wherein the first gate resistance connected to the first trench electrode is higher than a fourth gate resistance connected to the fourth trench electrode.

9. The semiconductor device according to claim 6, wherein the first gate resistance is connected to the fourth trench electrode.

10. The semiconductor device according to claim 6, wherein the third gate resistance is connected to the fourth trench electrode.

11. The semiconductor device according to claim 5, wherein the fourth insulating film between the fourth trench electrode and the first trench is smaller in thickness than the third insulating film between the third trench electrode and the second trench.

12. The semiconductor device according to claim 1, wherein, in a region interposed between the first trench and the second trench adjacent to each other, a seventh semiconductor region of the first conductivity type, an eighth semiconductor region of the second conductivity type, and a ninth semiconductor region of the second conductivity type are formed between the second semiconductor region and the second main surface in order from a side provided with the second semiconductor region, wherein the third trench electrode and the eighth semiconductor region are adjacent to each other with the third insulating film interposed therebetween, and wherein the fourth trench electrode and the eighth semiconductor region are adjacent to each other with the fourth insulating film interposed therebetween.

13. The semiconductor device according to claim 1, wherein an impurity concentration in the seventh semiconductor region is higher than an impurity concentration in the eighth semiconductor region.

\* \* \* \* \*